United States Patent
Giessler et al.

(10) Patent No.: US 12,212,256 B2
(45) Date of Patent: Jan. 28, 2025

(54) PARAMETER IDENTIFICATION FOR INDUCTION MACHINES

(71) Applicant: Innomotics GmbH, Nuremberg (DE)

(72) Inventors: Folke Giessler, Lisberg (DE); Mathias Lehmeier, Neumarkt (DE); Peter Stark, Bayreuth (DE); Harald Wiechmann, Hirschaid (DE)

(73) Assignee: Siemens Aktiengesellschaft, Munich (DE)

( * ) Notice: Subject to any disclaimer, the term of this patent is extended or adjusted under 35 U.S.C. 154(b) by 33 days.

(21) Appl. No.: 18/029,308

(22) PCT Filed: Aug. 25, 2021

(86) PCT No.: PCT/EP2021/073498
§ 371 (c)(1),
(2) Date: Mar. 29, 2023

(87) PCT Pub. No.: WO2022/069114
PCT Pub. Date: Apr. 7, 2022

(65) Prior Publication Data
US 2023/0370006 A1 Nov. 16, 2023

(30) Foreign Application Priority Data
Sep. 30, 2020 (EP) .................... 20199139

(51) Int. Cl.
*H02P 21/16* (2016.01)
*H02P 21/22* (2016.01)
*H02P 21/34* (2016.01)

(52) U.S. Cl.
CPC .............. *H02P 21/16* (2016.02); *H02P 21/22* (2016.02); *H02P 21/34* (2016.02); *H02P 2207/01* (2013.01)

(58) Field of Classification Search
CPC .......... H02P 21/16; H02P 21/22; H02P 21/34; H02P 2207/01
(Continued)

(56) References Cited

U.S. PATENT DOCUMENTS
2012/0038299 A1 2/2012 Villwock et al.

FOREIGN PATENT DOCUMENTS
EP 2 421 146 A1 2/2012

OTHER PUBLICATIONS

Huang et al. (CN 206114822 U)A Multiple Power Transformer Winding Deformation State Information Detecting Device Date Published Apr. 19, 2017 (Year: 2017).*
(Continued)

*Primary Examiner* — Jorge L Carrasquillo
(74) *Attorney, Agent, or Firm* — Henry M. Feiereisen LLC

(57) ABSTRACT

A method and a control apparatus for determining parameters for controlling an electric drive having an electric machine improve the start-up of the electric drive by applying a current indicator as a signal at three-phase winding connections of the electric machine, and measuring a d-component and a q-component of the stator voltage and of the stator current at the winding connections. In a first measurement step, a rotating current indicator is applied to the three-phase winding connections and the electric machine is oriented such that an exciter current in the q-axis assumes a minimum. In a second measurement step, when the rotor of the electric machine is stationary, a field winding of the electrical machine is short-circuited and a current indicator in form of a binary noise signal is applied to the winding connections. A stator impedance is then determined as a first control parameter.

7 Claims, 3 Drawing Sheets

(58) Field of Classification Search
USPC .......................................... 318/778, 400.02
See application file for complete search history.

(56) References Cited

OTHER PUBLICATIONS

Furansesuko et al. (JP H06237594 A)Method and Equipment for Operating Polyphase DC Motor Using PWM Chopping Signal in Determination of Zero Crossing Date Published Aug. 23, 1994 (Year: 1994).*
Yeh et al. (CN 101927700 B) Methods and Systems for Diagnosing Stator Windings in an Electric Motor Date Published Dec. 29, 2010 (Year: 2010).*
(JP 3457721 B2) Motor Operation Circuit Date Published Oct. 20, 2003 (Year: 2003).*
Pacas M. et al: "Identification of the mechanical system of a drive in the frequency domain"; IECON 2004—30th Annual Conference of IEEE Industrial Electronics Society (IEEE CAT. No. 04CH37609)2004 IEEE Piscataway, NJ, USA, Piscataway, NJ : IEEE Service Center, US; vol. 2, Nov. 2, 2004 (Nov. 2, 2004), pp. 1166-1171, XP010798967.
Hasni M. et al: "Synchronous machine parameter identification in frequency and time domain"; Serbian Journalof Electrical Engineering; Bd. 4, Nr. 1, Jan. 1, 2007;pp. 51-69; XP055775847;ISSN: 1451-4869; DOI: 10.2298/SJEE0701051H; Gefunden im Internet: URL:http://www.journal.ftn.kg.ac.rs/Vol_4- /05-Hasni-Djema-Touhami-Ibtiouen-Fadel-Caux.pdf.
Benn L. C. et al: "PWM spectrum analysis and optimization for model based condition monitoring and control": Conference Record of The 2001 IEEE Industry Applications Conference. 36th IAS Annual Meeting . Chicago, IL, Sep. 30-Oct. 4, 2001 [Conference Record of the IEEE Industry Applications Conference. IAS Annual Meeting], New York, NY: IEEE, US; Sep. 30, 2001 (Sep. 30, 2001), p. 1311, XP032142896.
PCT International Search Report and Written Opinion of International Searching Authority mailed Nov. 17, 2021 corresponding to PCT Internetional Application No. PCT/EP2021/073498 filed Aug. 25, 2021.

* cited by examiner

PARAMETER IDENTIFICATION FOR INDUCTION MACHINES

CROSS-REFERENCES TO RELATED APPLICATIONS

This application is the U.S. National Stage of International Application No. PCT/EP2021/073498, filed Aug. 25, 2021, which designated the United States and has been published as International Publication No. WO 2022/069114 A1 and which claims the priority of European Patent Application, Ser. No. 20/199,135.5, filed Sep. 30, 2020, pursuant to 35 U.S.C. 119 (a)-(d).

BACKGROUND OF THE INVENTION

The invention relates to a method for determining control parameters for controlling an electric drive by means of a vector control, the electric drive having at least one electric machine. The invention also relates to a control apparatus for an electric drive by means of vector control and an electric drive with such a control apparatus, a frequency converter and an electric machine.

An electric drive often has at least one frequency converter and one electric machine. The frequency converter controls the electric machine in an open-loop or closed-loop manner. There are various mathematical approaches to control. One approach is vector control. In order to parameterize the vector control of the frequency converter, parameters of the electric machine are required, which often result from the physical description, simulation or modeling of the electric machine. The required data is often not at all, incompletely or incorrectly available as equivalent circuit data. The parameters required for control are also referred to as control parameters.

At present, the parameters of the electric machine, also referred to as motor parameters, are in part determined in a very time-consuming manner by means of different approaches and tests during start-up.

The object of the invention is to improve the start-up of the electric drive.

SUMMARY OF THE INVENTION

This object is achieved by a method for determining control parameters for controlling an electric drive by means of a vector control, wherein the electric drive has at least one electric machine, wherein a current indicator is applied as a signal at three-phase winding connections of the electric machine, wherein in each case a d-component and a q-component of a stator voltage and of a stator current is measured at the winding connections, wherein in a first measurement step, a rotating current indicator is applied to the three-phase winding connections and the electric machine is oriented such that an exciter current in the q-axis assumes a minimum, wherein in a second measurement step, when the rotor of the electric machine is stationary, a field winding of the electric machine is short circuited and a current indicator in the form of a binary noise signal is applied to the three-phase winding connections, wherein a stator impedance is determined from the measured d-component and the q-component of the stator voltage and of the stator current as a first control parameter. This object is also achieved by a control apparatus for an electric drive for carrying out a vector control, wherein the control apparatus is configured to carry out such a method, wherein it is possible to determine and store at least one control parameter for vector control by means of the control apparatus in a startup phase, wherein it is possible to use at least one stored control parameter for vector control after completion of the start-up phase. This object is further achieved by an electric drive having a frequency converter and at least one electric machine, wherein the frequency converter has such a control apparatus, wherein a voltage measuring apparatus and a current measuring apparatus are arranged in the electrical connection between the frequency converter and the electric machine.

Further advantageous embodiments of the invention are specified in the dependent claims.

The invention is based, inter glia, on the recognition that start-up can be improved by virtue of the fact that in a measurement at standstill, for example by means of the control apparatus, the impedances in the d-axis and the q-axis of the electric machine can be determined. Hereinafter, the electric machine is also referred to as a motor. For this purpose, the rotor of the electric machine is first oriented and then held stationary. By applying a binary noise signal to the electrical motor connections, the stator currents and stator voltages are then measured at the connection terminals of the motor. The equivalent circuit data required is then determined using a numerical method, such as, for example, Gaussian or Newtonian. As these corresponding values are required as parameters for the control, in particular for the vector control, these values are also referred to as control parameters. These can be made available independently of the frequency of the control or can also be determined as a function of the frequency as a so-called frequency response. By using the frequency response as a control parameter, the behavior of the control at individual operating points can be optimized. Especially in the presence of resonance points, the control can be stabilized and repercussions for the load or the energy supply network can be reduced.

Measurement can be carried out by a measuring apparatus, also referred to as a measuring box. This measuring box can be operated with a comparatively low operating voltage of for example, 24V or 48V. This transmits the ascertained, calculated and/or determined data to the vector control. In this case, the measuring apparatus can be part of the control apparatus or can also be arranged outside the control apparatus. In any case, it is a measuring apparatus for an electric drive for determining the control parameters of a vector control, the measuring apparatus being configured to carry out the method as claimed in one of claims 1 to 5.

The electric machine is measured in the d- and q-axis. For this purpose, the d-component and the q-component of the stator current and/or the stator voltage are measured. A current indicator in the form of a binary noise signal is used to excite the measurement. The current indicator is positioned by means of corresponding adjustment of the commutation angle. In each case, the d-component and the q-component of the stator current and/or of the stator voltage is measured. In order to obtain further control parameters, the current in the short-circuited field winding can also be measured. After appropriate processing, for example by a Fast Fourier Transformation (FFT) of the data, a single control parameter or frequency responses of the stator impedance can be calculated as control parameters. Furthermore, when measuring in the d-axis, the frequency response of the ratio of the field to stator current can be calculated as a further control parameter.

These frequency responses can then be determined on the basis of the known equivalent circuit diagrams in the d- and q-axis and transformed into resistors, inductances and the winding ratio between the field and the stator winding by means of skillful choice of equivalent circuit diagram elements in such a way that the best possible correspondence can be produced. Known interpolation methods can be used for this purpose.

In order for the measurement to take place at defined positions, the q-axis is detected in the first measurement step via a minimum in the exciter current. The current indicator is rotated at a very low frequency in the machine. At the same time, the field winding is short circuited via a further current measuring apparatus so that the field current can also be measured. The induced signal on the field winding reaches a minimum in the q-axis. The associated transformation angle then corresponds to the q-axis. The exciter current can be determined via the field current or via the stator current.

In an advantageous embodiment of the invention, the binary noise signal is generated by a pseudo random number sequence with a feedback shift register, the shift register having a shift clock, a predeterminable frequency spectrum being generated by means of the shift clock. By generating the noise signal by means of a feedback shift register, a simple assignment to the frequency spectrum is possible in a particularly simple manner. This current indicator can be generated both in a simple manner, for example in a power converter which feeds the electric machine, and in addition, the measurement signals can be assigned to a corresponding frequency in a simple manner in an evaluation of the frequency response. The shift clock with which the bits are pushed through the register can be adjusted in an advantageous manner. In this case, corresponding spectra can be generated with different shift clocks. In addition, the number of periods is defined for each shift clock to determine the accuracy of the measurement and the duration of the measurement. With the noise signal on the basis of the pseudo random number sequence, both the measurement and the evaluation can be carried out in a simple manner in a closed-loop or open-loop control unit of the power converter, which feeds the electric machine. As a result, it is also possible to carry out this parameter identification in an automated manner.

In a further advantageous embodiment of the invention, the stator impedance is determined as a function of the frequency by means of a Fast Fourier Transformation. A Fast Fourier Transformation is a simple numerical evaluation of the measurement data and allows not only a single frequency-independent parameter to be generated, but also a frequency response as a control parameter. In this way, the operating points and the behavior of the electric machine can be described significantly more precisely. As a result, the electric machine can be controlled in a significantly simpler and more precise manner. In addition, critical operating points, for example due to resonances, can also be described in more detail. It is then possible for the control to produce stable control behavior even at these operating points.

In a further advantageous embodiment of the invention, the frequency response of the stator impedance is calculated for the real part and the imaginary part of the stator impedance. It has proven advantageous to indicate the complex value of the impedance as a real and imaginary part. This results in a physical reference to the sizes of the equivalent circuit diagram. As this often forms the basis and the physical reference to the control variables, the control can thus be configured in a particularly simple manner. Errors in parameter identification can also be determined in a simple manner on the basis of plausibility checks. Thus, this division results in a particularly robust and less error-prone control.

In a further advantageous embodiment of the invention, the field current is measured by the short-circuited field winding, the ratio of the field current to the stator current being determined as a second control parameter from the field current and the d-component of the stator current. In this way, further control parameters can be determined which allow the control behavior to be further improved.

In a further advantageous embodiment of the invention, the ascertained, calculated and/or determined control parameters are stored for use in the vector control. As a result of storage, the ascertainment of the parameters can also be carried out outside the control apparatus. However, even if these parameters are ascertained in the control apparatus, this ascertainment can be carried out via individual software routines. After completion of this ascertainment, the data is stored and used for the control of the drive, in particular for the vector control. The different software routines such as ascertaining the control parameters and execution of the control by means of vector control can then be carried out independently of one other. As a result, the structure of the control apparatus can be optimized.

BRIEF DESCRIPTION OF THE DRAWING

The invention is described and explained in more detail hereinafter with reference to the exemplary embodiments shown in the figures, in which.

DETAILED DESCRIPTION OF PREFERRED EMBODIMENTS

Figure 1:
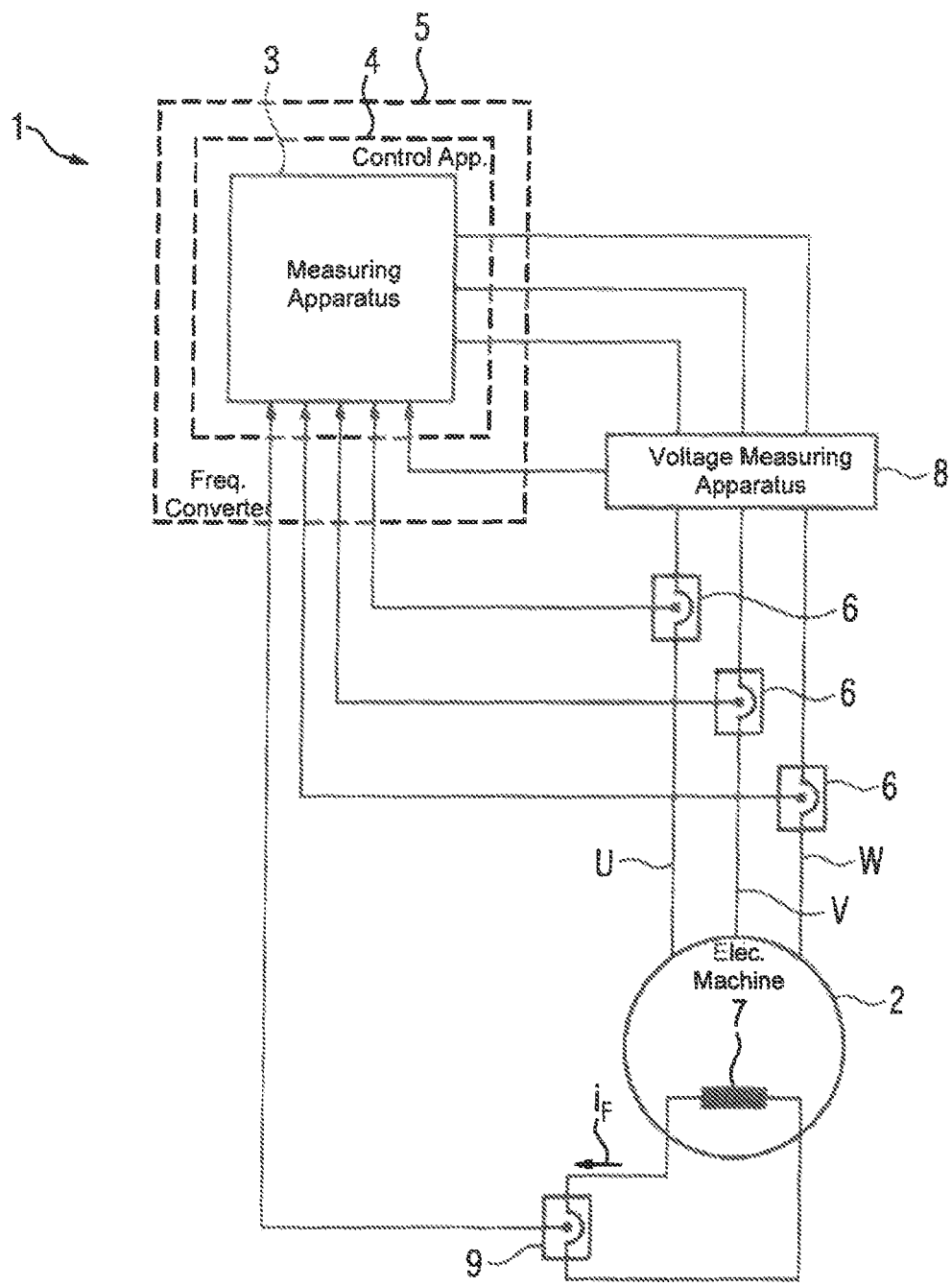
FIG. 1 shows an electric drive.

FIG. 1 shows an electric drive 1 with an electric machine 2 which is supplied with electrical energy via a frequency converter 5. The frequency converter 5 has a control apparatus 4. This control apparatus 4 has a measuring apparatus 3 for carrying out the proposed method. This measuring apparatus 3 does not necessarily have to be part of the frequency converter 5 or part of the control apparatus 4. However, it is advisable to use the frequency converter 5 as a voltage source for the electric drive 1, the voltage of which is predetermined by the measuring apparatus 3. The winding connections U, V, W are the connection terminals of the electric machine 2. These are connected to the stator winding of the electric machine 2. The stator current is measured at the winding connections U, V, W by means of the current measuring apparatuses 6 and the voltage between the winding connections is measured by means of a voltage measuring apparatus 8. It is sufficient to determine only two of the three voltages or currents as the third voltage or the third current can be mathematically determined from the other two.

In order to determine the control parameters, the signals of the current measuring apparatuses 6 and the voltage measuring apparatus 8 are transmitted to the measuring apparatus 3.

Furthermore, the electric machine 2 also has a field winding 7 in the rotor, also referred to as a rotor winding. The field winding 7 is short circuited by means of a further current measuring apparatus 9. The current measured in this case can also be transmitted to the measuring apparatus 3. From the signal of the further current measuring apparatus 9, the exciter current can be determined, with which the orientation of the d- and q-axis can take place.

Figure 2:
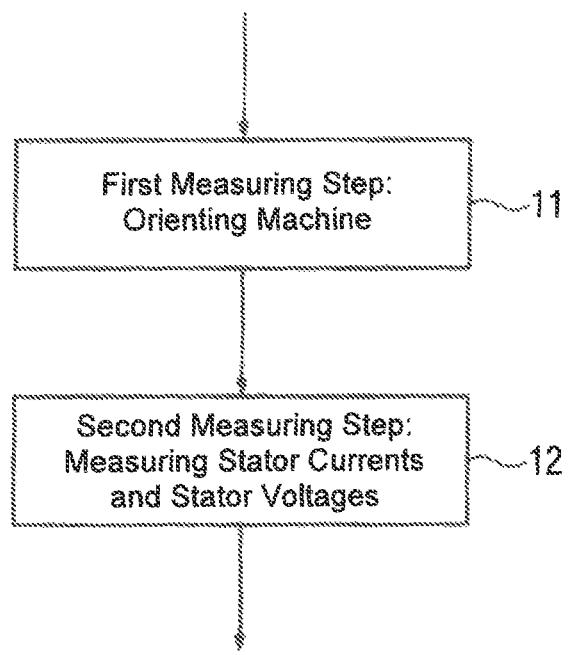
FIG. 2 shows a flow chart.

FIG. 2 shows a flow chart of the parameter determination. In a first measurement step 11, the electric machine is oriented. This means that the position of the d-axis and the q-axis offset by 90° is determined. For this purpose, a rotating current indicator is fed into the electric machine 2, the q-axis being detected at a minimum of the exciter current.

After detection has been successfully completed, the method changes to the second measurement step 12. In this case, the stator currents and the stator voltages are measured and the stator impedance Zd is determined therefrom as the first control parameter. These measurements can be carried out over a frequency range, so that the stator impedance results as a frequency response, i.e. as a function of different values of the frequency.

If this second measurement step is also completed, the control apparatus can carry out the vector control with the help of this data and control the electric machine 2 precisely in an open-loop manner and control it steadily in a closed-loop manner.

Figure 3:
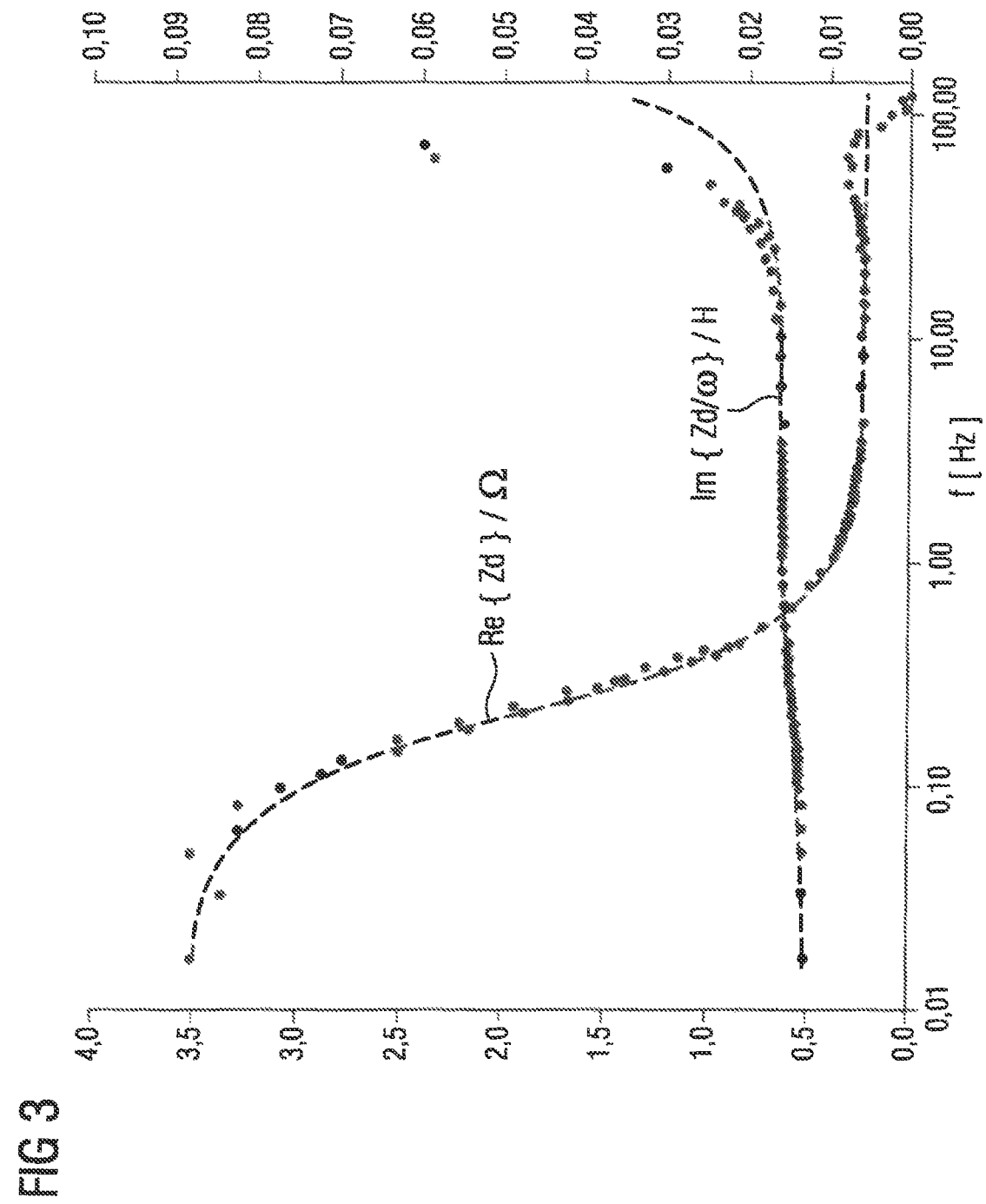
FIG. 3 shows the frequency response of a stator impedance.

FIG. 3 shows a typical measurement result of the stator impedance, divided into a real and an imaginary part. The left ordinate indicates the numerical values for the real part, the right ordinate for the imaginary part. From these measuring points, the frequency response of the stator impedance can be determined using interpolation methods which are already known.

In summary, the invention relates to a method for determining parameters for controlling an electric drive, the electric drive having at least one electric machine. In order to improve the start-up of the electric drive, it is proposed that a current indicator is applied to three-phase winding connections of the electric machine as a signal, wherein in each case a d-component and a q-component of the stator voltage and the stator current is measured at the winding connections, wherein in a first measurement step, a rotating current indicator is applied to the three-phase winding connections and the electric machine is oriented such that an exciter current in the q-axis assumes a minimum, wherein in a second measurement step, when the rotor of the electric machine is stationary, a field winding of the electric machine is short circuited and a current indicator in the form of a binary noise signal is applied to the winding connections, wherein a stator impedance is determined from the measured values as a first control parameter. The invention also relates to a control apparatus for an electric drive, the control apparatus being configured to carry out such a method.

What is claimed is:

1. A method for determining control parameters for a vector control controlling an electric drive having an electric machine, comprising:
   in a first measurement step, applying a rotating current indicator to the three-phase winding connections and orienting the electric machine such that an exciter current in a q-axis adopts a minimum value;
   in a second measurement step, when a rotor of the electric machine is stationary, short-circuiting a field winding of the electric machine and applying to the three-phase winding connections a current indicator in form of a binary noise signal;
   measuring, at three-phase winding connections, a d-component and a q-component of a stator voltage and of a stator current;
   determining from the measured d-component and the q-component of the stator voltage and of the stator current as a first control parameter a stator impedance;
   generating the binary noise signal using a pseudo-random number sequence produced with a feedback shift register having a shift clock, with different predeterminable frequency spectra being generated with a plurality of shift clocks.

2. The method of claim 1, wherein the stator impedance is frequency-dependent and determined using a Fast Fourier Transformation.

3. The method of claim 1, further comprising calculating a frequency response of the real part and the imaginary part of the stator impedance.

4. The method of claim 1, further comprising
   measuring a field current of the short-circuited field winding, and
   determining from the field current and the d-component of the stator current as a second control parameter a ratio of the field current to the stator current.

5. The method of claim 4, wherein at least one of the first and second control parameters are stored for use in the vector control.

6. A control apparatus for an electric drive configured to determine and store a control parameter for a vector control in a start-up phase, and to use the stored control parameter for the vector control after completion of the start-up phase, wherein the vector control determines the control parameter for the vector control by
   applying, in a first measurement step, a rotating current indicator to the three-phase winding connections and orienting the electric machine such that an exciter current in a q-axis adopts a minimum value;
   short-circuiting, in a second measurement step, when a rotor of the electric machine is stationary, a field winding of the electric machine and applying to the three-phase winding connections a current indicator in form of a binary noise signal;
   measuring, at three-phase winding connections, a d-component and a q-component of a stator voltage and of a stator current;
   determining from the measured d-component and the q-component of the stator voltage and of the stator current as a first control parameter a stator impedance;
   generating the binary noise signal using a pseudo-random number sequence produced with a feedback shift register having a shift clock, with different predeterminable frequency spectra being generated with a plurality of shift clocks.

7. An electric drive, comprising
   an electric machine,
   a frequency converter, and
   a voltage measuring apparatus and a current measuring apparatus arranged in an electrical connection between the frequency converter and the electric machine,
   wherein the frequency converter has a control apparatus for the electric drive configured to determine and store a control parameter for a vector control in a start-up phase of the electric drive, and to use the stored control parameter for the vector control after completion of the start-up phase, wherein the vector control determines the control parameter for the vector control by
   applying, in a first measurement step, a rotating current indicator to the three-phase winding connections and orienting the electric machine such that an exciter current in a q-axis adopts a minimum value;
   short-circuiting, in a second measurement step, when a rotor of the electric machine is stationary, a field winding of the electric machine and applying to the three-phase winding connections a current indicator in form of a binary noise signal;

measuring with the voltage measuring apparatus and the current measuring apparatus, at three-phase winding connections, a d-component and a q-component of a stator voltage and of a stator current;

determining from the measured d-component and the q-component of the stator voltage and of the stator current as a first control parameter a stator impedance; and generating the binary noise signal using a pseudo-random number sequence produced with a feedback shift register having a shift clock, with different predeterminable frequency spectra being generated with a plurality of shift clocks.

* * * * *